United States Patent [19]

Goetz

[11] Patent Number: 4,583,109
[45] Date of Patent: Apr. 15, 1986

[54] APPARATUS FOR COMPENSATING CORROSION EFFECTS IN INTEGRATED SEMICONDUCTOR CIRCUITS

[75] Inventor: Jürgen R. Goetz, Oberneuching, Fed. Rep. of Germany

[73] Assignee: Siemens Aktiengesellschaft, Berlin and Munich, Fed. Rep. of Germany

[21] Appl. No.: 410,511

[22] Filed: Aug. 23, 1982

[30] Foreign Application Priority Data

Sep. 23, 1981 [DE] Fed. Rep. of Germany ....... 3137914

[51] Int. Cl.$^4$ ............................................ H01L 27/04
[52] U.S. Cl. ...................................... 357/53; 357/52; 357/67; 357/68; 204/196
[58] Field of Search .................. 204/147, 196; 357/53, 357/52, 67, 68

[56] References Cited

U.S. PATENT DOCUMENTS

| | | | |
|---|---|---|---|
| 3,573,571 | 4/1971 | Brown | 357/53 X |
| 3,602,782 | 8/1971 | Klein | 357/53 |
| 3,611,071 | 10/1971 | Agusta | 357/52 X |
| 3,811,076 | 5/1974 | Smith | 357/53 X |
| 3,961,358 | 6/1976 | Polinsky | 357/53 |
| 4,063,274 | 12/1977 | Dingwall | 357/53 |
| 4,122,483 | 10/1978 | Hulstrunk | 357/53 X |
| 4,219,827 | 8/1980 | Kaiser | 357/53 X |

*Primary Examiner*—John F. Niebling
*Assistant Examiner*—Nam X. Nguyen
*Attorney, Agent, or Firm*—Herbert L. Lerner; Laurence A. Greenberg

[57] ABSTRACT

Apparatus for compensating corrosion effects due to highly mobile positive ions in insulating oxides of integrated semiconductor circuits, including a ring being disposed on the surface of a semiconductor circuit and being connected to a negative voltage, the ring being formed of a material resistant to corrosion due to positive ions during the operation of semiconductor circuits.

7 Claims, 1 Drawing Figure

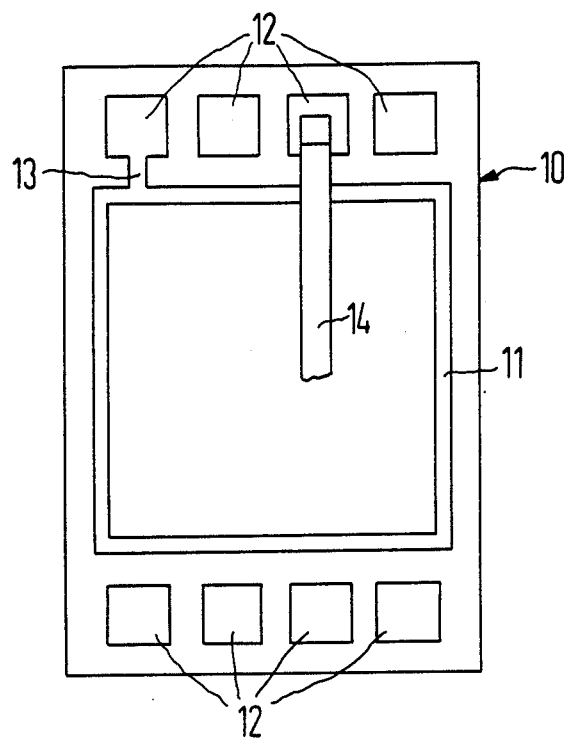

APPARATUS FOR COMPENSATING CORROSION EFFECTS IN INTEGRATED SEMICONDUCTOR CIRCUITS

The invention relates to an apparatus for compensating corrosion effects due to highly mobile positive ions in insulating oxides of integrated semiconductor circuits.

It is known that highly mobile positive ions are dissolved in insulating oxides of semiconductor components, particularly in integrated circuits. The ions can lead to the corrosion of aluminum conductor runs provided on the circuit or even to changes of the cutoff voltage of functional units present in the integrated semiconductor circuit.

It is accordingly an object of the invention to provide an apparatus for compensating corrosion effects in integrated semiconductor circuits, which overcomes the hereinafore-mentioned disadvantages of the heretofore-known devices of this general type, and particularly to eliminate the corrosion effects caused by the above-mentioned positive ions.

With the foregoing and other objects in view there is provided, in accordance with the invention, an apparatus for compensating corrosion effects due to highly mobile positive ions in insulating oxides of integrated semiconductor circuits, comprising a ring being disposed on the surface of a semiconductor circuit and being connected to a negative voltage, the ring being formed of a material resistant to corrosion due to positive ions during the operation of semiconductor circuits.

In accordance with another feature of the invention, the ring is formed of polysilicon.

In accordance with a further feature of the invention, the ring is formed of a silicide such as from the group consisting of tantalum silicide, molybdenum silicide and tungsten silicide.

In accordance with an added feature of the invention, there are provided terminal pads for the ring, the terminal pads being disposed within the semiconductor circuit.

In accordance with an additional feature of the invention, there are provided conductor runs being extended across given locations on the ring and being connected to the terminal pad electrodes, the ring having interruptions formed therein at said given locations.

In accordance with a concomitant feature of the invention, the ring is formed of polysilicon, and including at least one conducting connection being connected from the ring to at least one of the terminal pads.

Other features which are considered as characteristic for the invention are set forth in the appended claims.

Although the invention is illustrated and described herein as embodied in an apparatus for compensating corrosion effects in integrated semiconductor circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of the drawing which is a diagrammatic top plan view of an integrated semiconductor circuit with a ring according to the invention.

Referring now in detail to the single FIGURE of the drawing, it is seen that a ring 11 is applied on the surface of a diagrammatically illustrated semiconductor circuit 10, which is formed by an oxide plane. The ring 11 is formed, according to the invention, of a material which is resistant to corrosion due to positive ions, in the operation of semiconductor circuits. Possible materials which may be considered are polysilicon or silicides such as tantalum silicide, molybdenum silicide ot tungsten silicide. Terminal pads 12 may be disposed outside this ring. The electric circuit provided in the integrated circuit 10 is accessible from the outside through the terminal pads 12.

In order to allow the ring 11 to be connected to a negative voltage, a conducting connection 13, for instance, in the form of an aluminum conductor run or a polysilicon conductor run, can be brought to a terminal pad 12. The negative voltage for the ring 11 is then connected to the terminal pad 12.

The ring 11 connected to the negative voltage thus acts as a trap for the highly mobile positive ions dissolved in the oxide on the surface of the semiconductor circuit.

The utilization of a ring connected to the negative voltage is feasible for providing corrosion protection because practically positive ions alone and no negative ions are dissolved in insulating oxides of semiconductor components and integrated circuits.

Since conductor runs, especially in the form of aluminum conductor runs, which are to be protected against corrosion by the positive ions, are also extended on the surface of integrated semiconductor circuits, the ring 11 may also be interrupted, such as for bringing conductor runs to the connecting pads 12. Such a feature is shown diagrammatically in the FIGURE by a conductor run 14 which leads to a terminal pad 12.

The foregoing is a description corresponding to German Application No. 31 37 914.1, dated Sept. 23, 1981, the International priority of which is being claimed for the instant application and which is hereby made part of this application. Any discrepancies between the foregoing specification and the corresponding German application are to be resolved in favor of the latter.

I claim:

1. Apparatus for compensating corrosion effects due to highly mobile positive ions in insulating oxides of integrated semiconductor circuits, comprising a semiconductor circuit formed of an insulating oxide layer, and a ring being disposed on the surface of said insulating oxide layer forming said semiconductor circuit and being connected to a negative voltage, said ring being formed of a material which resists corrosion by preventing the formation of positive ions in said insulating oxide layer during the operation of semiconductor circuits.

2. Apparatus according to claim 1, wherein said ring is formed of polysilicon.

3. Apparatus according to claim 1, wherein said ring is formed of a silicide.

4. Apparatus according to claim 3, wherein said ring is formed of a silicide selected from the group consisting of tantalum silicide, molybdenum silicide and tungsten silicide.

5. Apparatus according to claim 1, including terminal pads for said ring, said terminal pads being disposed within the semiconductor circuit.

6. Apparatus according to claim 5, including conductor runs being extended across given locations on said ring and being connected to said terminal pads, said ring having interruptions formed therein at said given locations.

7. Apparatus according to claim 5 or 6, wherein said ring is formed of polysilicon, and including at least one conducting connection being connected from said ring to at least one of said terminal pads.

* * * * *